(12) United States Patent
Zhou et al.

(10) Patent No.: US 11,863,135 B2
(45) Date of Patent: Jan. 2, 2024

(54) CLASS D POWER AMPLIFICATION MODULATION SYSTEM FOR SELF-ADAPTIVE ADJUSTMENT OF AUDIO SIGNAL, METHOD, DEVICE, PROCESSOR AND STORAGE MEDIUM

(71) Applicant: CRM ICBG (WUXI) CO., LTD., Jiangsu (CN)

(72) Inventors: Xu Zhou, Jiangsu (CN); Hangjuan Jia, Jiangsu (CN); Dianjun Zhang, Jiangsu (CN); Fan Yang, Jiangsu (CN)

(73) Assignee: CRM ICBG (WUXI) CO., LTD., Jiangsu (CN)

( * ) Notice: Subject to any disclaimer, the term of this patent is extended or adjusted under 35 U.S.C. 154(b) by 0 days.

(21) Appl. No.: 17/927,847

(22) PCT Filed: Jul. 2, 2021

(86) PCT No.: PCT/CN2021/104288
§ 371 (c)(1),
(2) Date: Nov. 25, 2022

(87) PCT Pub. No.: WO2022/142236
PCT Pub. Date: Jul. 7, 2022

(65) Prior Publication Data
US 2023/0327616 A1    Oct. 12, 2023

(30) Foreign Application Priority Data
Dec. 30, 2020    (CN) .......................... 202011622922.8

(51) Int. Cl.
*H03F 3/217*    (2006.01)
*H03F 3/181*    (2006.01)

(52) U.S. Cl.
CPC ..... *H03F 3/2175* (2013.01); *H03F 2200/351* (2013.01)

(58) Field of Classification Search
CPC .. H03F 3/2175; H03F 2200/351; H03F 3/181; H03F 3/20
(Continued)

(56) References Cited

U.S. PATENT DOCUMENTS

| 8,115,542 B2 * | 2/2012 | Huang | H03F 3/217 |
| | | | 330/10 |
| 9,331,641 B2 * | 5/2016 | Zhang | H03F 3/217 |

(Continued)

FOREIGN PATENT DOCUMENTS

| CN | 101217262 A | 7/2008 |
| CN | 102215029 A | 10/2011 |

(Continued)

*Primary Examiner* — Hieu P Nguyen
(74) *Attorney, Agent, or Firm* — Tianhua Gu; GLOBAL IP SERVICES

(57) ABSTRACT

A Class D power amplification modulation system for self-adaptive adjustment of an audio signal is provided, including an amplification circuit module, a pulse width modulation (PWM) circuit module connected to the amplification circuit module, a frequency detection circuit module, a carrier generator module connected to the frequency detection circuit module, an amplitude detection circuit module, a direct current (DC) potential adjustment module connected to the amplitude detection circuit module, and a drive circuit module. A method, a device, a processor, and a computer-readable storage medium are also provided. The characteristics of the circuit in the signal time domain and frequency are improved by simultaneously controlling the amplitude and the frequency of the audio signal, to minimize power consumption of signals with different amplitudes and frequencies, and to improve EMI performance, or to balance the circuit power consumption and EMI characteristics.

10 Claims, 2 Drawing Sheets

(58) Field of Classification Search
USPC .................................... 330/10, 207 A, 251
See application file for complete search history.

(56) References Cited

U.S. PATENT DOCUMENTS 10,044,326 B2 * 8/2018 Chang .................... G11C 27/02
2013/0321079 A1 12/2013 Lin et al.

FOREIGN PATENT DOCUMENTS

| CN | 102843109 A | 12/2012 |
| CN | 105811901 A | 7/2016 |

\* cited by examiner

CLASS D POWER AMPLIFICATION MODULATION SYSTEM FOR SELF-ADAPTIVE ADJUSTMENT OF AUDIO SIGNAL, METHOD, DEVICE, PROCESSOR AND STORAGE MEDIUM

CROSS REFERENCE TO RELATED PATENT APPLICATION

The present application is the US national stage of PCT/CN2021/104288 filed on 2021 Jul. 2, which claims the priority of the Chinese patent application No. 202011622922.8 filed on 2020 Dec. 30, which application is incorporated herein by reference.

TECHNICAL FIELD

The present disclosure relates to the field of audio signal modulation, and in particular, to a Class D power amplification modulation system and a method for self-adaptive adjustment of an audio signal, a method, a device, and a processor for realizing self-adaptive adjustment and modulation of an audio signal of a Class D power amplifier and a computer-readable storage medium.

BACKGROUND

A modulation circuit of a class D power amplifier is used to compare an audio signal with a carrier wave generated by a carrier generator to modulate the carrier wave into a pulse width modulation (PWM) wave. Both the frequency of the PWM wave and the direct current (DC) potential of the audio signal are determined by the carrier generator. 1. This results in that in an entire audio range, the PWM wave amplified by a switch transistor works at a certain frequency, which is the same as the frequency of the PWM signal. Since the frequency of the audio signal ranges from 10 KHZ to 20 KHZ, in order to ensure that the distortion of the audio signal is small, the frequency of the PWM wave should be set at more than ten times the highest frequency (i.e., 20 KHZ) of the audio signal, which results in that when the frequency of the audio signal is low, the frequency of the carrier wave is much greater than ten times the frequency of the audio signal, and the electromagnetic interference (EMI) of the circuit is large. Meanwhile, the switching frequency of a power transistor is fast, which affects the life of the power transistor and increases the power consumption of the circuit. 2. If the DC potentials of the audio signals are different and these audio signals are respectively compared with the same carrier wave to modulate into PWM waves, the duty cycles of the PWM waves are also different. That is, the switching time of the power transistor is different.

FIG. 1 shows the duty cycles of the PWM waves obtained by comparing the DC potentials of the audio input signals with the carrier wave. The range of the carrier wave is 1 V-5 V. Assuming that a 3 V DC signal is input, at this time, the duty cycle of the PWM wave is 50%. If the potential of the DC signal is 2 V, the duty cycle is 33.3%, a conduction time of the switch transistor in a carrier wave cycle is reduced by 16.7%, thereby improving the efficiency of the circuit. In FIG. 1, m and n represent the DC potential of the input signal, m<n, the duty cycle corresponding to m is a, and the duty cycle corresponding to n is (a+b). It can be seen that the smaller the DC potential is, the smaller the duty cycle is.

The audio signal is a composite signal, which includes many signals of different frequencies. In the frequency spectrum, the amplitude of the audio signal is changing all the time. The amplitude or frequency of the audio signal is detected to adjust the duty cycle of the PWM wave of the Class D power amplifier, although the power consumption or EMI of the circuit can be reduced to a certain extent, there are limitations in the implementing and technical effects of the technical solution. In traditional technology, a high threshold comparator and a low threshold comparator are set for comparing an amplified audio signal, and only the frequency of the audio signal can be adjusted.

SUMMARY

The present disclosure provides a Class D power amplification modulation system for self-adaptive adjustment of an audio signal. The Class D power amplification modulation system includes: an amplification circuit module, connected to the audio signal, for amplifying the audio signal; a pulse width modulation (PWM) circuit module, connected to the amplification circuit module, for performing PWM processing on an amplified audio signal generated by the amplification circuit module to generate a PWM signal; a drive circuit module, connected to the PWM circuit module, for performing system drive processing on the PWM signal to feed back to the audio signal; a frequency detection circuit module, connected to the audio signal, for performing frequency detection processing on the audio signal; a carrier generator module, connected to the frequency detection circuit module and the PWM circuit module, for loading a signal generated after the frequency detection processing onto a carrier modulation signal to transmit the carrier modulation signal and the signal generated after the frequency detection processing to the PWM circuit module; an amplitude detection circuit module, connected to the audio signal, for performing amplitude detection processing on the audio signal; and a direct current (DC) potential adjustment module, connected to the amplitude detection circuit module, for performing DC potential analysis processing on a signal generated after the amplitude detection processing to generate a DC potential of the audio signal.

In an embodiment, the amplitude detection circuit module includes: an amplitude detection analogy-to-digital converter (ADC) unit, for detecting an amplitude of the audio signal and generating a digital signal corresponding to the amplitude of the audio signal; and an amplitude detection digital-to-analog converter (DAC) unit, for performing analysis processing on the digital signal to generate an analog signal corresponding to the digital signal.

In an embodiment, a sampling frequency of the amplitude detection ADC unit is 1 MHz.

The present disclosure provides a method for realizing self-adaptive adjustment and modulation of an audio signal of a Class D power amplifier. The method includes: (1) inputting the audio signal to the amplification circuit module, and performing amplification processing, by the amplification circuit module, on the audio signal; (2) inputting the audio signal to the frequency detection circuit module, and performing frequency detection processing, by the frequency detection circuit module, on the audio signal; (3) inputting the audio signal to the amplitude detection circuit module, and performing amplitude detection processing, by the amplitude detection circuit module, on the audio signal; (4) transmitting a signal generated after the frequency detection processing to the carrier generator module, loading the signal generated after the frequency detection processing onto the carrier modulation signal, and transmitting the signal generated after the frequency detection processing and the carrier modulation signal to the PWM circuit module; (5) performing, by the PWM circuit module, PWM processing on a signal generated after the amplification processing and a signal generated after the frequency detection processing to generate the PWM signal, and performing, by a drive circuit module, system drive processing on the PWM signal to feed back to the audio signal; and (6) transmitting a signal generated after the amplitude detection processing to the DC potential adjustment module, performing, by the DC potential adjustment module, DC potential analysis on the signal generated after the amplitude detection processing to generate the DC potential of the audio signal.

In an embodiment, the amplitude detection circuit module includes an amplitude detection ADC unit and an amplitude detection DAC unit, step (3) includes: detecting, by the amplitude detection ADC unit, an amplitude of the audio signal and generating a digital signal corresponding to the amplitude of the audio signal; and receiving and analyzing, by the amplitude detection DAC unit, the digital signal to generate an analog signal corresponding to the digital signal.

The present disclosure provides a method for realizing self-adaptive adjustment and modulation of an audio signal of a Class D power amplifier. The method includes: (A) performing amplification processing, frequency detection processing and amplitude detection processing on the audio signal respectively; (B) loading a signal generated after the frequency detection processing onto a carrier modulation signal, performing PWM processing on the signal generated after the frequency detection processing, the carrier modulation signal, and a signal generated after the amplification processing, performing system drive processing on a signal generated after the PWM processing, and combining a signal generated after the system drive processing and the audio signal; and (C) performing DC potential adjustment processing on a signal generated after the amplitude detection processing to generate a DC potential of the audio signal.

In an embodiment, the amplitude detection processing includes detecting an amplitude of the audio signal to generate a digital signal corresponding to the amplitude of the audio signal, and performing analysis processing on the digital signal to generate an analog signal corresponding to the digital signal.

The present disclosure provides a device for self-adaptive adjustment and modulation of an audio signal of a Class D power amplifier. The device includes: a processor, configured to execute computer-executable instructions; and a memory, storing one or more of the computer-executable instructions; when the computer-executable instructions are executed by the processor, the memory implements steps of the method for self-adaptive adjustment of the audio signal of the Class D power amplifier as mentioned above.

The present disclosure provides a processor for realizing self-adaptive adjustment and modulation of an audio signal of a Class D power amplifier. The processor is configured to execute computer-executable instructions, when the computer-executable instructions are executed by the processor, steps of the method for realizing self-adaptive adjustment and modulation of the audio signal of the Class D power amplifier as mentioned above are implemented.

The present disclosure provides a computer-readable storage medium storing a computer program. When the computer program is executed by a processor, steps of the method for realizing self-adaptive adjustment and modulation of the audio signal of the Class D power amplifier as mentioned above are implemented.

As described above, the present disclosure provides the Class D power amplification modulation system and the method for self-adaptive adjustment of the audio signal, the method, the device, and the processor for realizing self-adaptive adjustment and modulation of the audio signal of the Class D power amplifier and the computer-readable storage medium. The frequency detection circuit module detects the frequency of the audio signal, and the frequency of the carrier wave generated by the carrier generator module is adjusted according to the frequency of the audio signal. The higher the frequency of the audio signal, the higher the frequency of the carrier wave generated by the carrier generator module. By simultaneously controlling the amplitude and frequency of the audio signal, the following beneficial effects are achieved:

1. When the amplitude of the audio signal is small and the frequency of the audio signal is low, the duty cycle of the PWM signal is reduced and the frequency of the carrier wave is reduced, which can achieve high efficiency and good EMI characteristics.

2. When the amplitude of the audio signal is large and the frequency of the audio signal is high, the duty cycle of the PWM signal is increased, and the high frequency performance of the circuit is improved by the carrier wave.

3. When the amplitude of the audio signal is small and the frequency of the audio signal is high, the power consumption of the carrier wave with high frequency and the high frequency performance of the audio signal with small amplitude are improved by reducing the duty cycle and increasing the frequency of the carrier wave.

4. When the amplitude of the audio signal is large and the frequency of the audio signal is low, the frequency of the PWM wave is reduced, thereby increasing the efficiency and improving EMI characteristics.

The technical solution of the present disclosure adjusts the DC potential of the audio signal in real time, the duty cycle of the PWM signal varies with the DC potential of the audio signal, and the efficiency of the circuit is improved. In addition, when the amplitude of the audio signal is detected, the frequency of the carrier wave is adjusted according to the frequency of the audio signal. Both the power consumption and the EMI of the circuit of the present disclosure can be improved at the same time.

DETAILED DESCRIPTION OF THE PREFERRED EMBODIMENTS

In order to clearly describe the technical content of the present disclosure, the following combined with specific embodiments to be further described.

Before describing the embodiments of the present disclosure in detail, it should be noted that, terms such as "first", "second" and the like are only used to distinguish one entity or operation from another entity or operation, and do not necessarily require or imply any such actual relationship or order between these entities or operations. The term "includes," "including," or any other variation are intended to encompass a non-exclusive inclusion, such that a process, method, article, or apparatus including a list of elements includes not only those elements, but also other elements not expressly listed or inherent to such process, method, article, or apparatus.

Figure 1:
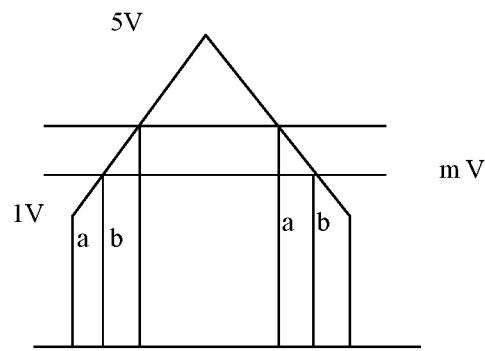
FIG. 1 is schematic diagram of a duty cycle of a PWM signal obtained by comparing a DC potential of an audio signal with a carrier wave according to an embodiment of the present disclosure.
Figure 2:
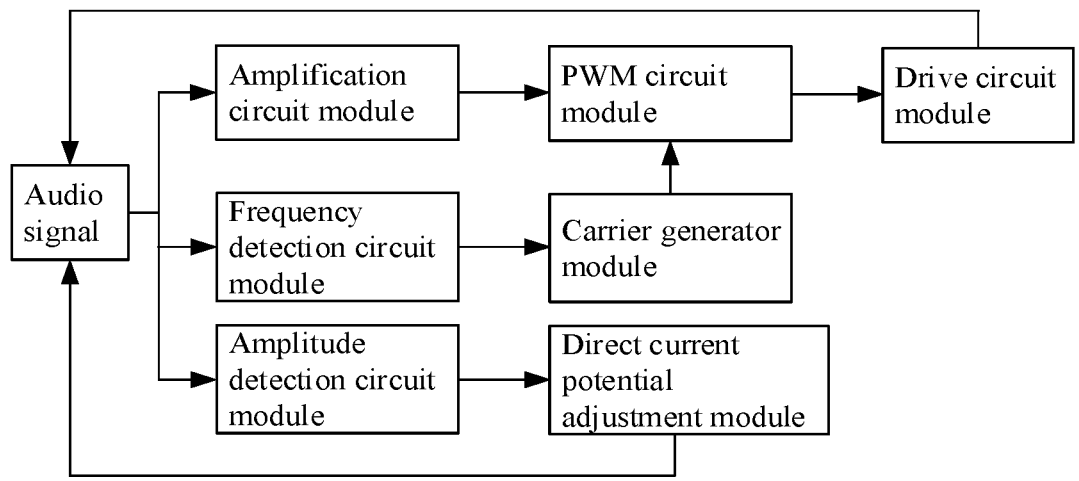
FIG. 2 is a structural diagram of a Class D power amplification modulation system for self-adaptive adjustment of an audio signal according to an embodiment of the present disclosure.

Please referring to FIG. 2, the present disclosure provides a Class D power amplification modulation system for self-adaptive adjustment of an audio signal. The Class D power amplification modulation system includes: an amplification circuit module, connected to the audio signal, for amplifying the audio signal; a pulse width modulation (PWM) circuit module, connected to the amplification circuit module, for performing PWM processing on an amplified audio signal generated by the amplification circuit module to generate a PWM signal; a drive circuit module, connected to the PWM circuit module, for performing system drive processing on the PWM signal to feed back to the audio signal; a frequency detection circuit module, connected to the audio signal, for performing frequency detection processing on the audio signal; a carrier generator module, connected to the frequency detection circuit module and the PWM circuit module, for loading a signal generated after the frequency detection processing onto a carrier modulation signal to transmit the carrier modulation signal and the signal generated after the frequency detection processing to the PWM circuit module; an amplitude detection circuit module, connected to the audio signal, for performing amplitude detection processing on the audio signal; and a direct current (DC) potential adjustment module, connected to the amplitude detection circuit module, for performing DC potential analysis processing on a signal generated after the amplitude detection processing to generate a DC potential of the audio signal.

In an embodiment, the amplitude detection circuit module includes: an amplitude detection analogy-to-digital converter (ADC) unit, for detecting an amplitude of the audio signal and generating a digital signal corresponding to the amplitude of the audio signal; and an amplitude detection digital-to-analogy converter (DAC) unit, for performing analysis processing on the digital signal to generate an analog signal corresponding to the digital signal.

In an embodiment, a sampling frequency of the amplitude detection ADC unit is 1 MHz The present disclosure provides a method for realizing self-adaptive adjustment and modulation of an audio signal of a Class D power amplifier according to the Class D power amplification modulation system. The method includes: step (1), inputting the audio signal to the amplification circuit module, and performing amplification processing, by the amplification circuit module, on the audio signal; step (2), inputting the audio signal to the frequency detection circuit module, and performing frequency detection processing, by the frequency detection circuit module, on the audio signal; step (3), inputting the audio signal to the amplitude detection circuit module, and performing amplitude detection processing, by the amplitude detection circuit module, on the audio signal; step (4), transmitting, a signal generated after the frequency detection processing to the carrier generator module, loading, the signal generated after the frequency detection processing onto the carrier modulation signal, and transmitting the signal generated after the frequency detection processing and the carrier modulation signal to the PWM circuit module; step (5), performing, by the PWM circuit module, PWM processing on a signal generated after the amplification processing and a signal generated after the frequency detection processing to generate the PWM signal, and performing, by a drive circuit module, system drive processing on the PWM signal to feed back to the audio signal; and step (6), transmitting a signal generated after the amplitude detection processing to the DC potential adjustment module, performing, by the DC potential adjustment module, DC potential analysis on the signal generated after the amplitude detection processing to generate the DC potential of the audio signal.

In an embodiment, the amplitude detection circuit module includes an amplitude detection ADC unit and an amplitude detection DAC unit. Step (3) includes: detecting, by the amplitude detection ADC unit, an amplitude of the audio signal and generating a digital signal corresponding to the amplitude of the audio signal; and receiving and analyzing, by the amplitude detection DAC unit, the digital signal to generate an analog signal corresponding to the digital signal.

The present disclosure provides a method for realizing self-adaptive adjustment and modulation of an audio signal of a Class D power amplifier. The method includes: step (A), performing amplification processing, frequency detection processing and amplitude detection processing on the audio signal respectively; step (B), loading a signal generated after the frequency detection processing onto a carrier modulation signal, performing PWM processing on the signal generated after the frequency detection processing and the carrier modulation signal and a signal generated after the amplification processing, performing system drive processing on a signal generated after the PWM processing, and combining a signal generated after the system drive processing and the audio signal; and step (C), performing DC potential adjustment processing on a signal generated after the amplitude detection processing to generate a DC potential of the audio signal.

In an embodiment, the amplitude detection processing includes: detecting an amplitude of the audio signal to generate a digital signal corresponding to the amplitude of the audio signal, and performing analysis processing on the digital signal to generate an analog signal corresponding to the digital signal.

The present disclosure provides a device for self-adaptive adjustment and modulation of an audio signal of a Class D amplifier. The device includes: a processor, configured to execute computer-executable instructions; and a memory, storing one or more of the computer-executable instructions. When the computer-executable instructions are executed by the processor, the memory implements steps of the method for self-adaptive adjustment and modulation of the audio signal of the Class D power amplifier as mentioned above.

The present disclosure provides a processor for realizing self-adaptive adjustment and modulation of an audio signal of a Class D power amplifier. The processor is configured to execute computer-executable instructions, when the computer-executable instructions are executed by the processor, steps of the method for realizing self-adaptive adjustment and modulation of the audio signal of the Class D power amplifier as mentioned above.

The present disclosure provides a computer-readable storage medium storing a computer program. When the computer program is executed by a processor, the steps of the method for realizing self-adaptive adjustment and modulation of the audio signal of the Class D power amplifier as mentioned above are implemented.

In an embodiment, the amplification circuit module performs amplification processing on the audio signal, and the frequency detection circuit module detects the frequency of the audio signal. The frequency of the carrier wave generated by the carrier generator module is adjusted according to the frequency of the audio signal. The higher the frequency of the audio signal is, the higher the frequency of the carrier wave generated by the carrier generator module is. The audio signal processed respectively by the amplification circuit module and the frequency detection circuit module is sent to the PWM circuit module for modulation of the duty cycle of the PWM signal, and the signal processed by the PWM circuit module is sent to the drive circuit module for driving, and the signal processed by the drive circuit module is combined with the original audio signal. Meanwhile, the amplitude detection circuit module detects the amplitude of the audio signal. The amplitude detection circuit module includes: the amplitude detection ADC unit, for detecting the amplitude of the audio signal and generating the digital signal corresponding to the amplitude of the audio signal; and the amplitude detection DAC unit, for performing analysis processing on the digital signal to generate the analog signal corresponding to the digital signal, and sending the analog signal to the DC potential adjustment module to generate the DC potential of the audio signal. The amplitude of the audio signal is proportional to a conduction time of the drive transistor in the drive circuit module. That is, the greater the amplitude of the audio signal is, the longer the conduction time of the drive transistor is. Meanwhile, the frequency of the carrier wave of the carrier generator module is the same as that of the drive transistor, that is, the higher the frequency of the carrier wave is, the faster the switching frequency of the driver transistor is. The method for realizing self-adaptive adjustment and modulation of the audio signal of the Class D power amplifier of the present disclosure improves the characteristics of the circuit in the signal time domain and the frequency, minimizes power consumption of the signals in different amplitudes and frequencies, and improves EMI performance, or balances the power consumption and EMI characteristics.

In an embodiment, amplification processing, frequency detection processing and amplitude detection processing are performed on the audio signal respectively. The frequency of the carrier wave is adjusted according to the frequency of the audio signal. The higher the frequency of the audio signal is, the higher the frequency of the carrier wave is. The modulation of the duty cycle of the PWM signal is performed on the signal generated after the amplification processing and the signal generated after the frequency detection processing. Meanwhile, the amplitude of the audio signal is detected, a digital signal corresponding to the amplitude of the audio signal is generated, the digital signal is modulated into the analogy signal corresponding to the digital signal, and the DC potential adjustment processing is performed on the analogy signal to generate the DC potential of the audio signal. By adjusting the DC potential of the audio signal in real time, the duty cycle of the PWM signal varies with the DC potential of the audio signal. Meanwhile, when the DC potential of the audio signal is changed, the frequency of the carrier wave will be detected and adjusted, so that the power consumption and EMI of the circuit can be improved at the same time.

Figure 3:
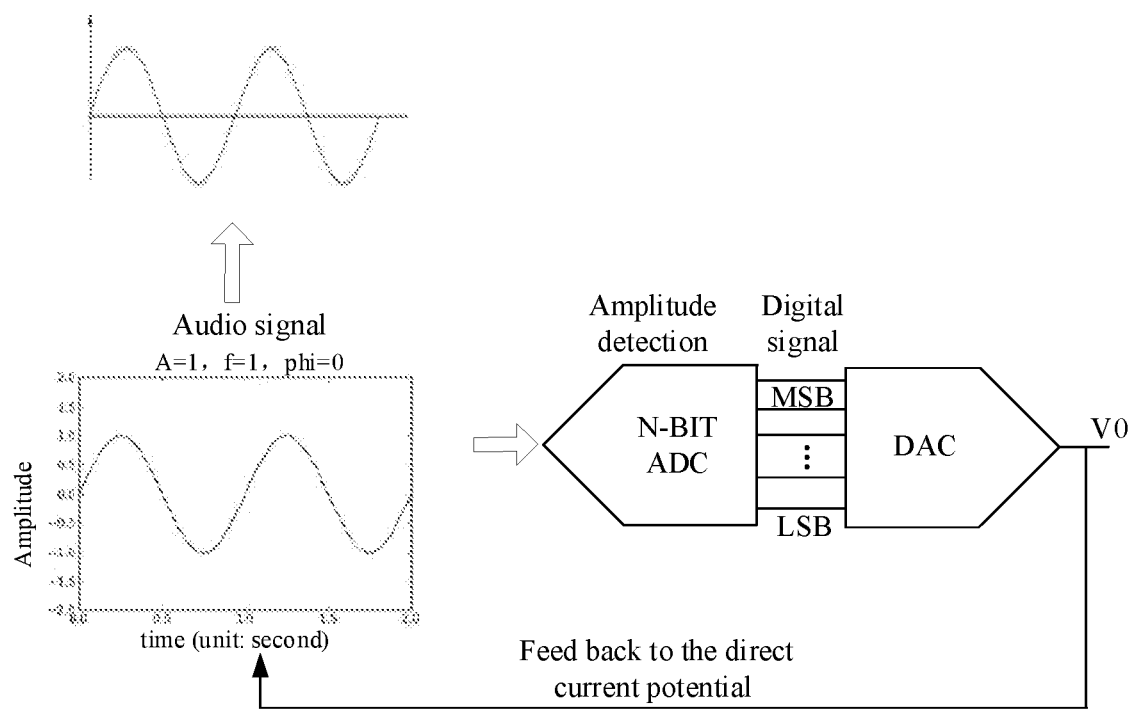
FIG. 3 is a schematic diagram of the working principle of amplitude detection modulation according to an embodiment of the present disclosure.

In an embodiment, referring to FIG. 3, the principle of the method for realizing self-adaptive adjustment and modulation of the audio signal of the Class D power amplifier is as follows: the amplitude detection ADC unit of the amplitude detection circuit module detects the amplitude of the analogy audio signal. The sampling frequency of the amplitude detection ADC unit is 1 MHz, which is much greater than the highest frequency (e.g., 20 KHz) of the audio signal. The sampling frequency should ensure the integrity of the collected data. The digital signal (including least significant bit (LSB) and most significant bit (MSB)) is obtained through detecting the amplitude of the audio signal. The amplitude detection DAC unit performs analysis processing on the digital signal to generate the analogy signal VO, and the analog signal VO acts as the DC potential of the audio signal. The smaller the amplitude of the audio signal is, the smaller the DC potential VO is. The duty cycle of the PWM signal obtained after the audio signal is processed by the amplification circuit and the PWM circuit is changed. That is, the smaller the DC potential of the audio signals with the same amplitude and frequency is, the smaller the duty cycle of the PWM signal is, so that the conduction time of the drive transistor is short and the efficiency of the circuit is improved. The frequency detection circuit module detects the frequency of the audio signal, and the frequency of the carrier wave of the carrier generator module is adjusted according to the frequency of the audio signal. The higher the frequency of the audio signal is, the greater the frequency of the carrier wave of the carrier generator module is. By using ADC/DAC to detect the amplitude of the input signal, and the amplitude of the input signal (the audio signal) is analyzed into an analog signal to act as the DC potential of the input signal. The smaller the amplitude of the input signal is, the smaller the DC potential is. When the amplitude of the signal is detected, the frequency of the carrier wave signal is adjusted according to the frequency of the input signal. The greater the frequency of the input signal is, the greater the frequency of the carrier wave is.

It will be understood that the same or similar parts of the above embodiments may refer to each other, and what is not described in detail in some embodiments can be seen as the same or similar in other embodiments.

It should be noted that in the description of the present disclosure, the terms "first", "second", etc. are used for descriptive purposes only and are not to be construed as indicating or implying relative importance. In addition, in the description of the present disclosure, unless otherwise stated, "plurality" is meant to refer to at least two.

It should be understood that the various parts of the present disclosure may be implemented with hardware, software, firmware, or a combination thereof. In the above embodiments, multiple steps or methods may be implemented with software or firmware stored in memory and executed by a suitable instruction execution device. For example, if implemented in hardware, as in another embodiment, any one of the following techniques or a combination thereof known in the art may be used: discrete logic circuits with logic gate circuits for implementing logic functions on data signals, specialized integrated circuits with suitable combinations of logic gate circuits, Programmable Gate Arrays (PGAs), Field Programmable gate Arrays (FPGAs), etc.

Those skilled in the art can understand that all or part of the steps carried out to implement the method of the above embodiments can be accomplished by instructing the associated hardware through a program, and the program can be stored in a computer-readable storage medium. When executed, the program includes one or a combination of the steps of a method embodiment.

In addition, each functional unit in each embodiment of the present disclosure may be integrated in a processing module, or each unit may be physically present alone, or two or more units may be integrated in a single module. The above integrated module can be implemented either in the form of hardware or in the form of a software functional module. The integrated module can also be stored in a computer-readable storage medium if it is implemented as a software function module and sold or used as a stand-alone product.

The storage medium mentioned above can be Read-Only Memory, disks or CD-ROMs, etc.

In the description of this specification, reference to the terms "an embodiment," "some embodiments," "an example," "specific examples," or "some examples" means that specific features, structures, materials, or characteristics described in connection with the embodiments or examples are included in at least one embodiment or example of the present disclosure. In this specification, the schematic representations of the above terms do not necessarily refer to the same embodiment or example. Furthermore, the specific features, structures, materials, or characteristics described may be combined in any one or more embodiments or examples in a suitable manner.

Although embodiments of the present disclosure have been shown and described above, it is understood that the above embodiments are exemplary and are not to be construed as limiting the present disclosure, and that variations, modifications, replacements and variants of the above embodiments may be made by those of ordinary skill in the art within the scope of the present invention.

The present disclosure provides the Class D power amplification modulation system and the method for self-adaptive adjustment of the audio signal, the method, the device, and the processor for realizing self-adaptive adjustment of the audio signal of the Class D power amplifier and the non-transitory computer-readable storage medium. The frequency detection circuit module detects the frequency of the audio signal, and the frequency of the carrier wave generated by the carrier generator module is adjusted according to the frequency of the audio signal. The higher the frequency of the audio signal, the higher the frequency of the carrier wave generated by the carrier generator module. By simultaneously controlling the amplitude and frequency of the audio signal, the following beneficial effects are achieved:

1. When the amplitude of the audio signal is small and the frequency of the audio signal is low, the duty cycle is reduced and the frequency of the carrier wave is reduced, which can achieve higher efficiency and good EMI characteristics;
2. When the amplitude of the audio signal is large and the frequency of the audio signal is high, the duty cycle of the PWM signal is increased, and the high frequency performance of the circuit is improved by the carrier wave;
3. When the amplitude of the audio signal is small and the frequency of the audio signal is high, the frequency of the carrier wave is improved by reducing the duty cycle, thereby improving the power consumption of the carrier wave with high frequency and improving the high frequency performance of the audio signal with small amplitude;
4. When the amplitude of the audio signal is large and the frequency of the audio signal is low, the frequency of the PWM wave is reduced, thereby increasing the efficiency and improving EMI characteristics.

At the same time, compared with the prior art where a high threshold comparator and a low threshold comparator are set for comparing the amplified audio signal, the technical solution of the present disclosure adjusts the DC potential of the signal in real time, the duty cycle of PWM signal varies with the DC potential of the audio signal, and the efficiency of the circuit is improved. In addition, when the amplitude of the audio signal is detected, the frequency of the carrier wave signal is adjusted according to the frequency of the signal. Compared with adjusting the frequency of the signal only, the power consumption and EMI of the circuit of the present disclosure can be improved at the same time.

In this specification, the present disclosure has been described with reference to particular embodiments thereof. However, it is clear that various modifications and transformations can still be made without departing from the spirit and scope of the present disclosure. Accordingly, the specification and accompanying drawings should be considered as illustrative rather than limiting.

What is claimed is:

1. A Class D power amplification modulation system for self-adaptive adjustment of an audio signal, comprising:
    an amplification circuit module, connected to the audio signal, for amplifying the audio signal;
    a pulse width modulation (PWM) circuit module, connected to the amplification circuit module, for performing PWM processing on an amplified audio signal generated by the amplification circuit module to generate a PWM signal;
    a drive circuit module, connected to the PWM circuit module, for performing system drive processing on the PWM signal to feed back to the audio signal;
    a frequency detection circuit module, connected to the audio signal, for performing frequency detection processing on the audio signal;
    a carrier generator module, connected to the frequency detection circuit module and the PWM circuit module, for loading a signal generated after the frequency detection processing onto a carrier modulation signal to transmit the carrier modulation signal and the signal generated after the frequency detection processing to the PWM circuit module;
    an amplitude detection circuit module, connected to the audio signal, for performing amplitude detection processing on the audio signal; and
    a direct current (DC) potential adjustment module, connected to the amplitude detection circuit module, for performing DC potential analysis processing on a signal generated after the amplitude detection processing to generate a DC potential of the audio signal.

2. The Class D power amplification modulation system for self-adaptive adjustment of the audio signal according to claim 1, wherein the amplitude detection circuit module comprises:
    an amplitude detection analogy-to-digital converter (ADC) unit, for detecting an amplitude of the audio signal and generating a digital signal corresponding to the amplitude of the audio signal; and
    an amplitude detection digital-to-analogy converter (DAC) unit, for performing analysis processing on the digital signal to generate an analog signal corresponding to the digital signal.

3. The Class D power amplification modulation system for self-adaptive adjustment of the audio signal according to claim 2, wherein a sampling frequency of the amplitude detection ADC unit is 1 MHz.

4. A method for realizing self-adaptive adjustment and modulation of an audio signal of a Class D power amplifier according to the system of claim 1, comprising:
    (1) inputting the audio signal to the amplification circuit module, and performing amplification processing, by the amplification circuit module, on the audio signal;

(2) inputting the audio signal to the frequency detection circuit module, and performing frequency detection processing, by the frequency detection circuit module, on the audio signal;

(3) inputting the audio signal to the amplitude detection circuit module, and performing amplitude detection processing, by the amplitude detection circuit module, on the audio signal;

(4) transmitting a signal generated after the frequency detection processing to the carrier generator module, loading the signal generated after the frequency detection processing onto the carrier modulation signal, and transmitting the signal generated after the frequency detection processing and the carrier modulation signal to the PWM circuit module;

(5) performing, by the PWM circuit module, PWM processing on a signal generated after the amplification processing and a signal generated after the frequency detection processing to generate the PWM signal, and performing, by a drive circuit module, system drive processing on the PWM signal to feed back to the audio signal; and (6) transmitting a signal generated after the amplitude detection processing to the DC potential adjustment module, performing, by the DC potential adjustment module, DC potential analysis on the signal generated after the amplitude detection processing to generate the DC potential of the audio signal.

5. The method for realizing self-adaptive adjustment and modulation of the audio signal of the Class D power amplifier according to claim 4, wherein the amplitude detection circuit module comprises an amplitude detection ADC unit and an amplitude detection DAC unit, step (3) comprises:

detecting, by the amplitude detection ADC unit, an amplitude of the audio signal and generating a digital signal corresponding to the amplitude of the audio signal; and receiving and analyzing, by the amplitude detection DAC unit, the digital signal to generate an analog signal corresponding to the digital signal.

6. A method for realizing self-adaptive adjustment and modulation of an audio signal of a Class D power amplifier, comprising:

(A) performing amplification processing, frequency detection processing and amplitude detection processing on the audio signal respectively;

(B) loading a signal generated after the frequency detection processing onto a carrier modulation signal, performing PWM processing on the signal generated after the frequency detection processing, the carrier modulation signal, and a signal generated after the amplification processing, performing system drive processing on a signal generated after the PWM processing, and combining a signal generated after the system drive processing and the audio signal; and (C) performing DC potential adjustment processing on a signal generated after the amplitude detection processing to generate a DC potential of the audio signal.

7. The method for realizing self-adaptive adjustment and modulation of the audio signal of the Class D power amplifier according to claim 6, wherein the amplitude detection processing comprises:

detecting an amplitude of the audio signal to generate a digital signal corresponding to the amplitude of the audio signal, and performing analysis processing on the digital signal to generate an analog signal corresponding to the digital signal.

8. A device for self-adaptive adjustment and modulation of an audio signal of a Class D power amplifier, comprising:

a processor, configured to execute computer-executable instructions; and a memory, storing one or more of the computer-executable instructions; wherein when the computer-executable instructions are executed by the processor, the memory implements steps of the method for self-adaptive adjustment and modulation of the audio signal of the Class D power amplifier as in claim 6.

9. A processor for realizing self-adaptive adjustment and modulation of an audio signal of a Class D power amplifier, wherein the processor is configured to execute computer-executable instructions, when the computer-executable instructions are executed by the processor, steps of the method for realizing self-adaptive adjustment and modulation of the audio signal of the Class D power amplifier as in claim 6 are implemented.

10. A computer-readable storage medium storing a computer program, wherein when the computer program is executed by a processor, steps of the method for realizing self-adaptive adjustment and modulation of the audio signal of the Class D power amplifier as in claim 6 are implemented.

* * * * *